United States Patent
Tang

(10) Patent No.: US 10,227,758 B2
(45) Date of Patent: Mar. 12, 2019

(54) CONTROL DEVICE FOR FAUCET ASSEMBLIES

(71) Applicant: GUANGZHOU SEAGULL KITCHEN AND BATH PRODUCTS CO.,LTD, Guangzhou (CN)

(72) Inventor: Taiying Tang, Guangzhou (CN)

(73) Assignee: GUANGZHOU SEAGULL KITCHEN AND BATH PRODUCTS CO.,LTD, Guangzhou (CN)

( * ) Notice: Subject to any disclaimer, the term of this patent is extended or adjusted under 35 U.S.C. 154(b) by 120 days.

(21) Appl. No.: 15/323,539

(22) PCT Filed: Apr. 1, 2016

(86) PCT No.: PCT/CN2016/078258
§ 371 (c)(1),
(2) Date: Jan. 3, 2017

(87) PCT Pub. No.: WO2017/147967
PCT Pub. Date: Sep. 8, 2017

(65) Prior Publication Data
US 2018/0179743 A1 Jun. 28, 2018

(30) Foreign Application Priority Data

Feb. 29, 2016 (CN) .......................... 2016 1 0111970
Feb. 29, 2016 (CN) ..................... 2016 2 0151897 U

(51) Int. Cl.
*E03C 1/05* (2006.01)
*G08B 5/36* (2006.01)
(Continued)

(52) U.S. Cl.
CPC .............. *E03C 1/055* (2013.01); *E03C 1/044* (2013.01); *G08B 5/36* (2013.01); *H03K 17/962* (2013.01);
(Continued)

(58) Field of Classification Search
USPC .......................................................... 137/801
See application file for complete search history.

(56) References Cited

U.S. PATENT DOCUMENTS

| 3,337,778 A * | 8/1967 | Becker .................. G01F 23/241 307/116 |
| 2007/0152074 A1* | 7/2007 | Stowe ..................... E03C 1/055 236/12.1 |
| 2010/0139779 A1* | 6/2010 | Lautzenheiser ........... E03C 1/04 137/14 |

* cited by examiner

*Primary Examiner* — Marina A Tiet Jen
*Assistant Examiner* — Daphne M Barry
(74) *Attorney, Agent, or Firm* — CBM Patent Consulting, LLC

(57) ABSTRACT

The invention discloses a control device for faucet assemblies. Faucet assemblies comprises a faucet spout with a first and a second water outlet; a first water supply pipe communicating with second water outlet, a second water supply pipe communicating with first water outlet and containing a water outlet pipe section connected with first water outlet and a first water inlet pipe section and a second inlet pipe section communicating with water outlet pipe section, control device comprising a first and a second solenoid valve respectively provided on first and second water inlet pipe section; a capacitive touching unit disposed on faucet spout; and electrically connected to a second control unit, when touch time is less than first predetermined time, opening second solenoid valve, and is greater than second predetemined time, opening first solenoid valve. The invention has effects of meeting different demands, combining touch and manual, and being convenient operation.

8 Claims, 6 Drawing Sheets

(51) Int. Cl.
*E03C 1/044* (2006.01)
*H03K 17/96* (2006.01)
(52) U.S. Cl.
CPC ..... *E03C 2201/40* (2013.01); *Y10T 137/9464* (2015.04)

CONTROL DEVICE FOR FAUCET ASSEMBLIES

This application is the U.S. national phase of International Application No. PCT/CN2016/078258 Filed on 1 Apr. 2016 which designated the U.S. and claims priority to Chinese Application Nos. CN 201610111970.8 filed on 29 Feb. 2016 and Nos. CN 201620151897.2 filed on 29 Feb. 2016, the entire contents of each of which are hereby' incorporated by reference.

TECHNICAL FIELD

The present invention relates to a field of automatic control, in particular to control device for faucet assemblies.

BACKGROUND

Popular water purifieres are mostly a simple filter installed outside faucet outlet mouth on current market. Multi-stage filter device with filtering function is placed in front end of water inlet of faucet in individual high-end direct drinking machine, but these filter device do not having function capable of spouting pure hot water or boiling water, and can not really achieve hot water to drink, and only have a single cold water drinking function. With continuous improvement of living standards, people put forward higher requirements on health, safety, convenient and practical aspect of water. Single-function straight drinking water purifier has been unable to meet rapid making tea, brewing milk powder and other daily needs. And the faucet of existing direct drinking water purifier controls mostly water through handle of traditional mechanical valve core. The mechanical valve core is easy wear and appears water unable turning off situation after use of a period of time.

DESCRIPTION

A purpose of the present invention is to solve at least above problems and to provide at least the advantages that will be described later.

Another purpose of the present invention is to provide control device for faucet assemblies, the faucet assemblies comprising:

A faucet spout with a first water outlet and a second water outlet;

A first water supply pipe communicating with the second water outlet, and

A second water supply pipe communicating with the first water outlet, the second water supply pipe containing a water outlet pipe section connected with the first water outlet and a first water inlet pipe section and a second inlet pipe section communicating with the water outlet pipe section.

The control device comprising a first solenoid valve provided on the first water inlet pipe section to control on-off of the first water inlet pipe section;

A second solenoid valve provided on the second water inlet pipe section to control on-off of the second water inlet pipe section;

A capacitive touching unit disposed on the faucet spout, the capacitive touching unit for sensing touch time of human body and emitting touch signal; and A second control unit electrically connected to the capacitive touching unit to switch the first solenoid valve and the second solenoid valve in accordance with a touch signal of the capacitive touching unit to control opening and closing of the first water outlet, when touch time is less than a first predetermined time, turning on the second solenoid valve, when touch time is greater than a second predetermined time, turning on the first solenoid valve.

Preferably, Wherein the capacitive touching unit comprises:

A touch key disposed on the faucet spout;

A capacitive sensing module connected with the touch key to sense action of human body touching the touch key; and A touch sensing circuit connected to the capacitive sensing module to detect touch time of human body touching the capacitive sensing module and to generate a touch signal according to the touch time.

Preferably, the control device for faucet assemblies also includes a delay switch for adjusting the second control unit for setting delay turn-off time;

Wherein the second control unit does not receive touch signal of the capacitive touch unit again within a continuous delay turn-off time after receiving last touch signal of the capacitive touch unit. The control module controls the first solenoid valve or the second solenoid valve to be closed.

Preferably, the first predetermined time is 1 s, the second predetermined time is 3 s.

Preferably, the control device also comprises a manual valve provided on the faucet spout to control opening and closing of the first water outlet.

Preferably, the first water inlet pipe section and the second water inlet pipe section include a throat section with a smaller cross-sectional diameter. The first water inlet pipe section and the second water inlet pipe section are further provided with:

A housing made of hard material and wrapped around the throat section to define a air-containing space around the throat section; the throat section having an opening to the air-containing space;

A flexible membrane covering layer made of elastic material and disposed sealingly on inner side of the housing so that the air-containing space has an elastically stretchable sealed boundary;

The first water inlet pipe section provided with a heater connected in series in the water inlet pipe section and disposed on the upstream side of the housing along water outlet direction to heat water flow of flowing into the throat section.

Preferably, the first solenoid valve is disposed on the upstream side of the heater along rater outlet direction, and controls water flow entering into the heater;

The second solenoid valve is disposed on the upstream side of the housing along water outlet direction, and controls water flow entering into the water outlet pipe section.

Preferably, the control device also comprises a third solenoid valve disposed on the downstream side of the heater along water outlet direction, and controls backflow water from the water outlet pipe section to enter the heater.

Preferably, the control device also comprises a display device disposed on a touch switch, the display device comprising:

A red indicator light and a blue indicator light which are turned on or off in accordance with the states of the first solenoid valve and the second solenoid valve;

And a first control unit controlling turning on or off of the red indicator light and the blue indicator light.

Preferably, a filter is provided on the second water supply pipe.

The advantages of the present invention are as follows.

1. The faucet assemblies can produce four kinds of water under control of the control device to meet various water demand of kitchen. The control device of the invention can directly regulate water outlet temperature of the first water outlet in the faucet assemblies to meet different water needs;

2. The capacitive touch unit controls cold water and hot water of the second water supply pipe. For example, traditional manual valve controls cold water and hot water of the first water supply pipe through mechanical handle. Touch control and traditional manual control are combined. Operation is more convenient;

3. The capacitive touch unit is equipped with a display device. When the display device is touched, the blue light lightens, the faucet assemblies flow out of cold water. When the display device is pressed, the red light lightens, the faucet assemblies flow out of hot water to enhance user experience;

4. Since the control device provides a automatic delay switch, when touching control cold water, the faucet assemblies can delay automatically turning off water.

Other advantages, objects, and features of the invention will be showed in part through following description, and in part will be understood by those skilled in the art from study and practice of the invention.

DETAILED DESCRIPTION

Figure 1:
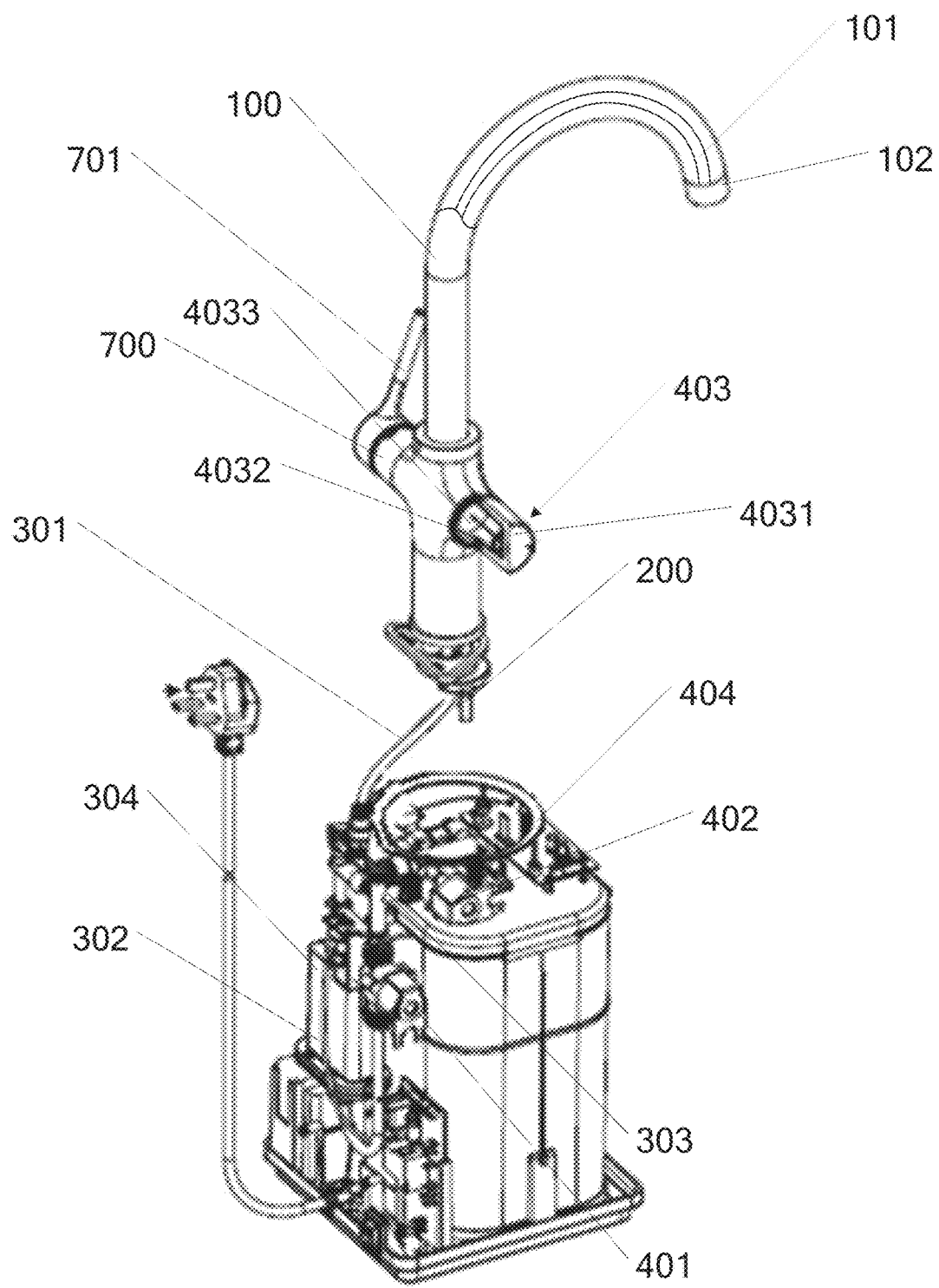
FIG. 1 is a overall structural view of the control device for faucet assemblies.

The present invention will now be described in further detail with reference to the accompanying drawings as required:

As shown in FIG. 1, The present invention provides a control device for faucet assemblies, the faucet assemblies comprising A faucet spout 100 with a first water outlet 101 and a second water outlet 102;

A first water supply e 200 communicating with the second water outlet 102, and A second water supply pipe communicating with the first water outlet 101, the second water supply pipe containing a water outlet pipe section 301 connected with the first water outlet 101 and a first water inlet pipe section 302 and a second inlet pipe section 303 communicating with the water outlet pipe section 301.

Figure 2:
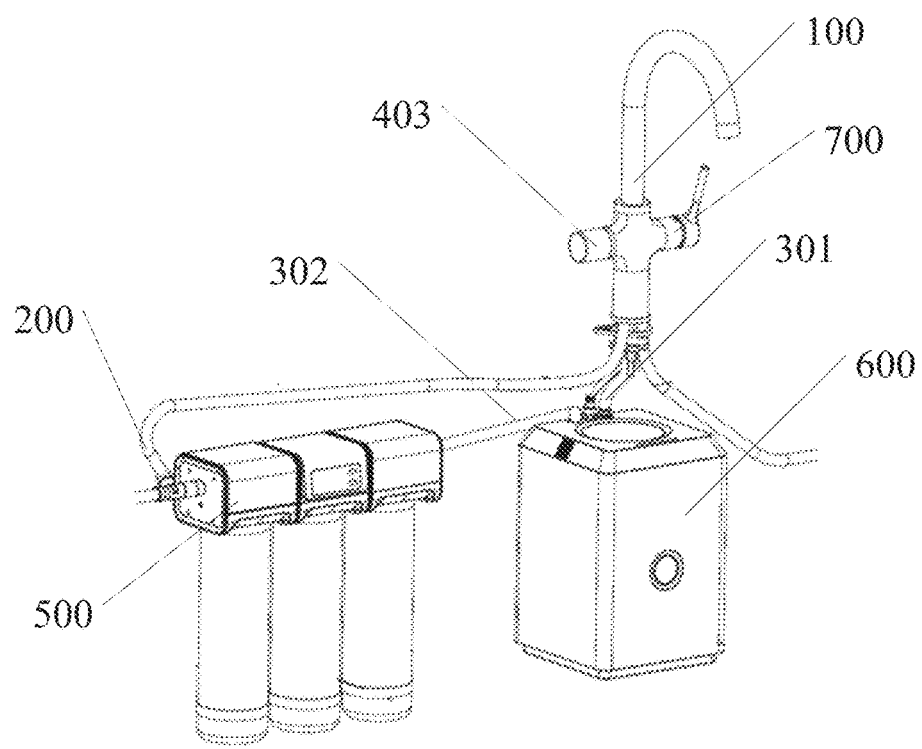
FIG. 2 is a overall structural view of the faucet assemblies of the control device for faucet assemblies.

The control device comprising a first solenoid valve 401 provided on the first water inlet pipe section 302 to control on-off of the first water inlet pipe section 302;

A second solenoid valve 402 provided on the second water inlet pipe section 303 to control on-off of the second water inlet pipe section 303;

A capacitive touching unit 403 disposed on the faucet spout 100, the capacitive touching unit 403 for sensing touch time of human body and emitting touch signal; and A second control unit 404 electrically connected to the capacitive touching unit 403 to switch the first solenoid valve 401 and the second solenoid valve 402 in accordance with a touch signal of the capacitive touching unit 403 to control opening and closing of the first water outlet 101, when touch time is less than a first predetermined time, turning on the second solenoid valve 402, when touch time is greater than a second predetermined time, turning on the first solenoid valve 401. As shown in FIG. 2, the faucet spout also comprises a heater 600 provided on the first water inlet pipe section 302. The heater 600 is used for heating water flow flowing into the first water inlet pipe section 302. For example, the first water inlet pipe section 302 and the second water inlet pipe section 303 share a filter. The filter 500 comprises, for example, a three-stage filter element for filtering water flow flowing into the first water inlet pipe section 302 and the second water inlet pipe section 303. The user controls the first water outlet 101 to communicate with the first water inlet pipe section 302 or the second water inlet pipe section 303 by touching the capacitive touching unit 403 to effect switching different water flow of the first water outlet. Capacitive touching sensing principle of human body: When touching touch area of the faucet spout, because the human body is equivalent to a capacitor connected to the earth, so between inner metal sheet of the touch area and the earth forming a capacitor. The induction capacitance is usually several pF to dozens of pF., When touching the touch area of the faucet spout, sensing capacitance will be detected by the touch sensing circuit. Using of this most basic principle, capacitive sensing module of touching unit can detect whether there is a manual touch action based on capacitance change.

In one of embodiment, as shown in FIG. 1, the capacitive touching unit 403 comprises:

A touch key 4031 disposed on the faucet spout 100;

A capacitive sensing module 4032 connected with the touch key 4031 to sense action of human body touching the touch key 4031; and A touch sensing circuit 4033 connected to the capacitive sensing module 4032 to detect touch time of human body touching the capacitive sensing module and to generate a touch signal according to the touch time.

In one of embodiment, the control device for faucet assemblies also includes a delay switch for adjusting the second control unit for setting delay turn-off time;

Wherein the second control unit 404 does not receive touch signal of the capacitive touching unit 403 again within a continuous delay turn-off time after receiving last touch signal of the capacitive touch unit 403. The control module controls the first solenoid valve 401 or the second solenoid valve 402 to be closed. Of course, the first solenoid valve 401 and the second solenoid valve 402 may also be closed by the capacitive touching unit 403. For example, the first solenoid valve 401 or the second solenoid valve 402 is closed by again touching the capacitive touching unit 403 and touching time is less than the first predetermined time. The operator can touch the capacitive touch unit one time to flow cold water, and then water is turned off by touching one time again. Pressing and holding for 3 seconds to flow hot water, hand release hot water immediately stopping.

In one of embodiment, the first predetermined time is 1 s, and the second predetermined time is 3 s. Touching determination method: when touch time is less than 1 s for touch, touch time is more than 3 s for lasting press In one of embodiment, as shown in FIG. 1, the control device also comprises a manual valve 700 provided on the faucet spout 100 to control opening and closing of the first water outlet 101. For example, the manual valve 700 has a manual handle 701, and an operator controls water flow of the second water outlet 102 by turning the manual handle 701. For example, the second water outlet 102 is connected to a water mixing valve which is connected with a tap water cold water pipe and a tap water hot water pipe, and tap water cold water and hot water is mixed by water mixing valve and is discharged from the second water outlet 102 by turning adjustment of the manual handle.

Figure 3:
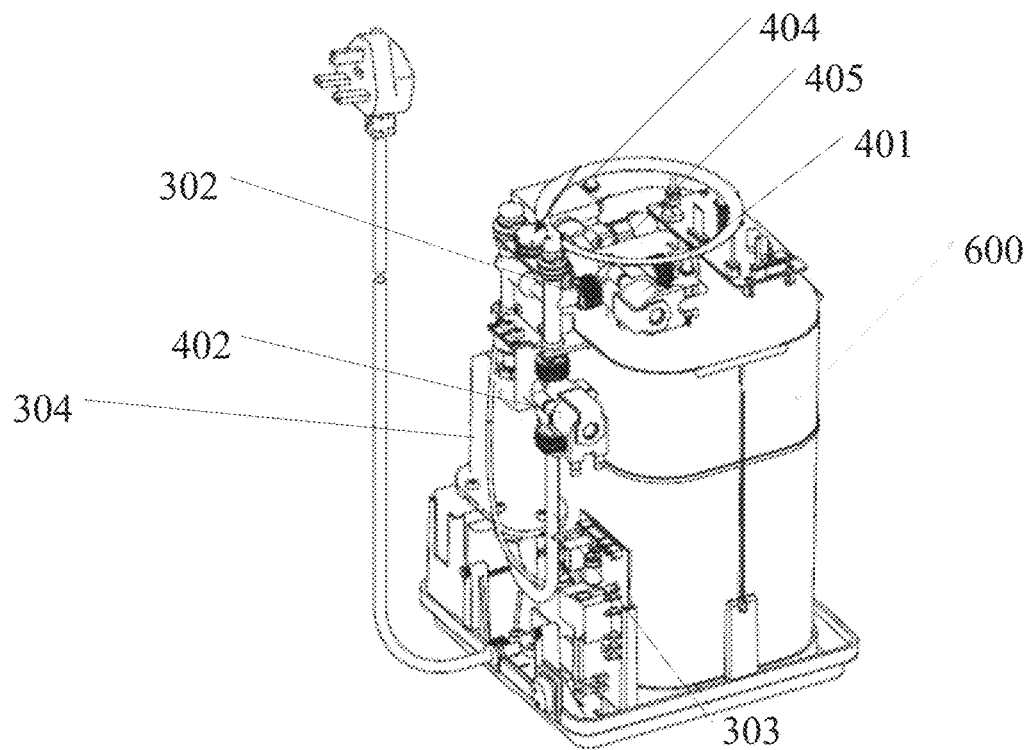
FIG. 3 is a structural view of the control device for faucet assemblies.

In one of embodiment, as shown in FIG. 3, the first water inlet pipe section 302 and the second water inlet pipe section 303 include a throat section with a smaller cross-sectional diameter, The first water inlet pipe section 302 and the second water inlet pipe section 303 are further provided with:

A housing 304 made of hard material and wrapped around the throat section to define a air-containing space around the throat section; the throat section having an opening to the space; a flexible membrane covering layer disposed within the housing 304, which is made of an elastic material and disposed sealingly on inner side of the housing 304 so that the air-containing space has an elastically stretchable sealed boundary;

The first water inlet pipe section 302 is provided with a heater 600 connected in series in the water inlet pipe section and disposed on the upstream side of the housing 304 along water outlet direction to heat water flow to flow into the throat section.

Figure 4:
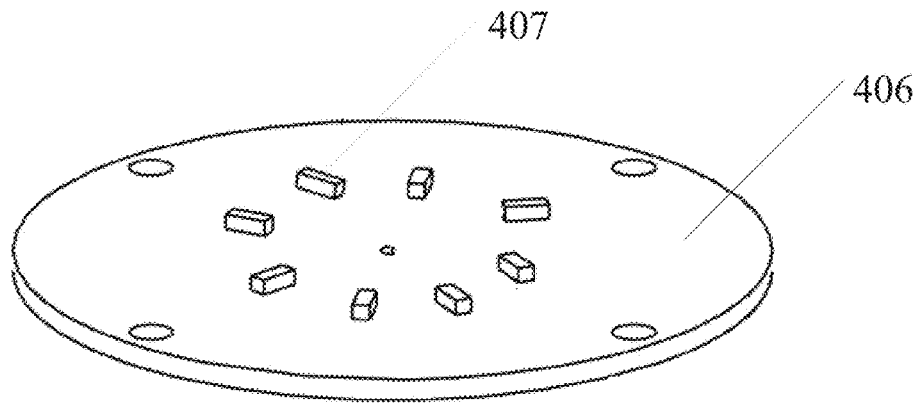
FIG. 4 is a structural view of the display device of the control device for faucet assemblies.

In one of embodiment, as shown in FIG. 4, the first solenoid valve 401 is disposed on the upstream side of the heater 600 along water outlet direction, and controls water flow entering into the heater 600;

The second solenoid valve 402 is disposed on the upstream side of the housing 304 along water outlet direction, and controls water flow entering into the water outlet pipe section.

In one of embodiment, as show in FIG. 3, the control device also comprises a third solenoid valve 405 disposed on the downstream side of the heater 600 along water outlet direction, and controls backflow water from the water outlet pipe section 301 to enter the heater 600.

In one of embodiment, as shown in FIG. 4, the control device also comprises a red indicator light and a blue indicator light 407 disposed on the touch switch, which are turned on or off in accordance with states of the first solenoid valve 401 and the second solenoid valve 402;

A first control unit 406 controls turning on or off of the red indicator light and the blue indicator light 407. For example, the red indicator light and the blue indicator light are disposed on a touch control light plate 406.

In one of embodiment, as shown in FIG. 1, a filter 500 is provided on the second water supply pipe.

Figure 5:
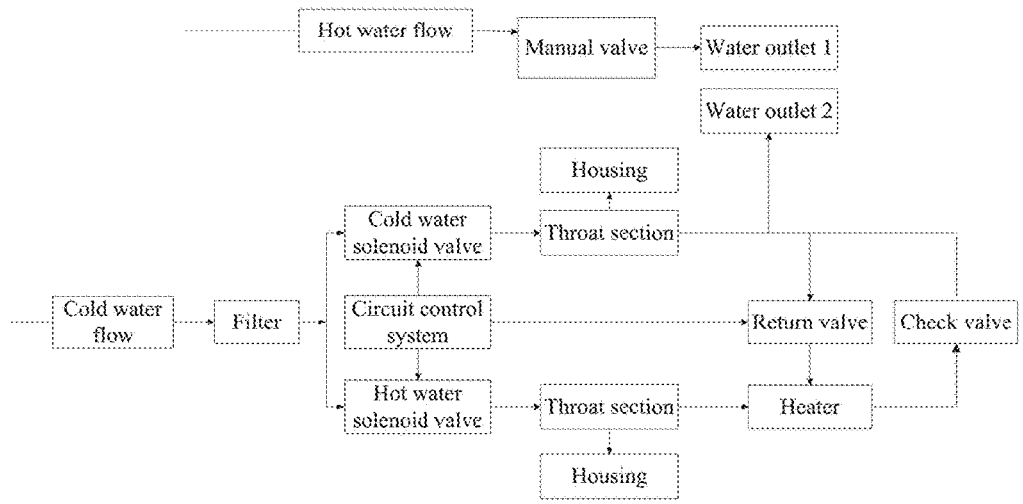
FIG. 5 is a structural block diagram of the control device for faucet assemblies.

In one of embodiment, as shown in FIG. 5, the second water outlet 102 of the faucet assemblies is connected to the manual valve 700 which connects tap water hot water and tap water cold water and controls water outlet temperature of the second water outlet 102 by adjustment of the manual valve 700. The tap water cold water passes through the filter 500 and is divided into two paths. One path water successively passes through the first solenoid valve 401, the throat section on the first inlet pipe section, the housing, the heater 600 and the check valve and enter into the first water outlet 102. And the other path water successively passes through the second solenoid valve 402, the throat section disposed on the second inlet pipe section and the housing and enter into the first water outlet 101. A third solenoid valve 405 is provided between the heater 600 and the first water outlet 101, for example, a return valve for backflow hot water of the first water outlet 101. The first solenoid valve 401, the second solenoid valve 402, and the return valve 405 are all operated under control of a circuit control system.

In one of embodiment, cold water is from the cold water inlet. One path water directly flows without filtering into the manual valve of the faucet assemblies. Hot water is from the hot water inlet to the manual valve. Manual valve is controlled by the manual handle to adjust mixing ratio of cold water and hot water to manually control water outlet temperature of the second water outlet 102. The other path cold water is from the cold water inlet through the filter 500 to the first solenoid valve 401 and the second solenoid valve 402. The first solenoid valve 401 and the second solenoid valve 402 are controlled by the circuit control system. The first water outlet 101 and the second water outlet 102 are provided in the water outlet of the faucet spout 100, and filtered water is discharged from the first water outlet 101 provided in the middle of the faucet spout. The non-filtered water is discharged from the second water outlet 102 provided at the edge of the faucet spout. The faucet spout is also provided with a touch key 4031 for controlling the water outlet mode of the first water outlet 101. Touching the touch key, the blue light lightens, and the faucet assemblies flow out of cold water, and then touching the blue light, the blue light is off at the same time cold water is off (or use automatic delay mode to turn off cold water), pressing down the touch key, the red light lightens for 3 seconds, and the faucet assemblies flow out of hot water. Keeping hot water flows out all the time, hands off, the red light is off at the same time hot water is off.

Figure 6:
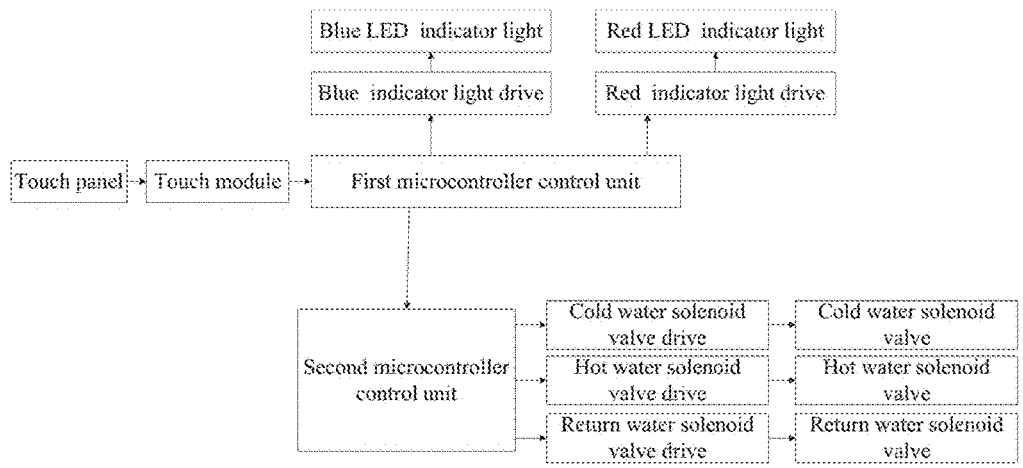
FIG. 6 is a circuit control view of the control device for faucet assemblies.

FIG. 6 shows a circuit control view of the control device according to the invention. Wherein the first control unit such as the first microcontroller control unit controls the blue indicator light drive and the red indicator light drive; the second control unit such as the second microcontroller control unit for controlling the three solenoid valve drive. The first control unit and the second control unit are arranged on the touch panel.

Figure 7:
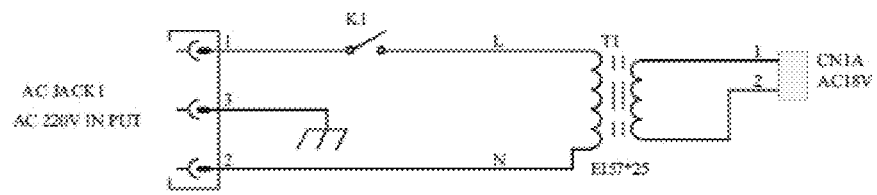
FIG. 7 is a structural view of sectional circuit of power source of the control device for faucet assemblies.

FIG. 7 shows a part circuit of power source of the control device of the invention. Wherein AC JACK1 is power line of AC. K1 is a power switch. T1 is a transformer. CN1A is connection cable interface.

Figure 8:
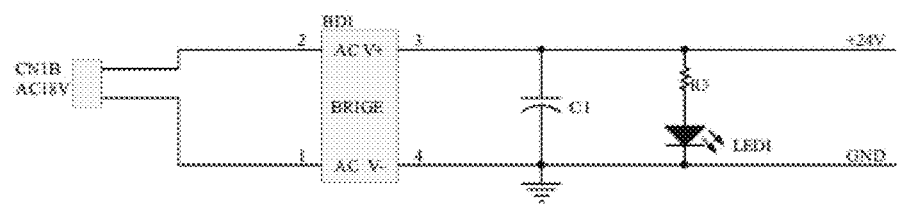
FIG. 8 is a rectifier filter circuit view of poi supply part of the control device for faucet assemblies.

FIG. 8 shows a rectifier filter circuit of power supply part of the control device of the invention. Wherein CN1B is connection cable interface. BD1 is a bridge rectifier. C1 is a filter capacitor. R3 is a current limiting resistor of power indicator light LED1.

Figure 9:
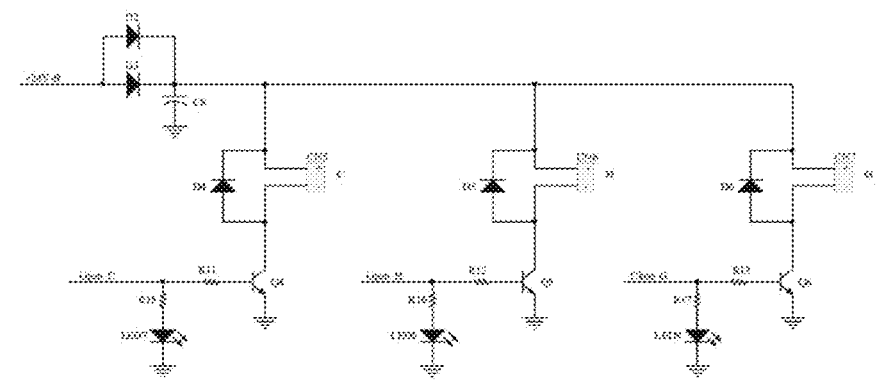
FIG. 9 is a drive circuit view of solenoid valve of the control device for faucet assemblies.

FIG. 9 shows a drive circuit view of the solenoid valve of the control device of the invention. Wherein D2 and D3 are isolating diode. C8 is a filter capacitor. Q4 is a cold water solenoid valve drive transistor. Q5 is a hot water solenoid valve drive transistor. Q6 is a return solenoid valve drive transistor. LED7 is a cold water solenoid valve action indicator light. LED8 is a hot water solenoid valve action indicator light. LED9 is a backflow solenoid valve action indicator light. CN5 is a cold water solenoid valve interface. CN6 is a hot water solenoid valve interface. CN7 is a return solenoid valve interface. D4, D5 and D6 are counter electromotive force absorption diodes of each solenoid valve.

Figure 10:
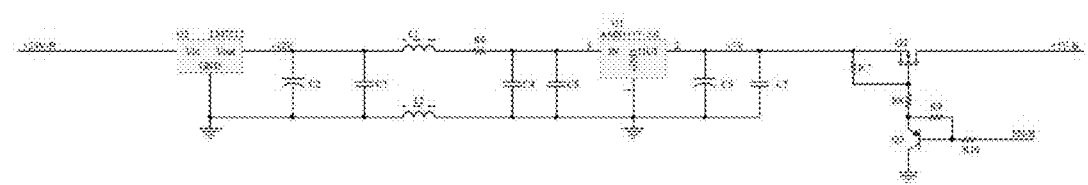
FIG. 10 is a power source part view of control circuit of the control device for faucet assemblies.

FIG. 10 shows circuit power source part view of the control device of the invention. Wherein U2 is a 12V regulator chip. C2 is a filter capacitor. L1, L2, C3, R6 and C4 form LC filter circuit. U1 is a 5V regulator chip. C6 and C7 are filter capacitors. Q2 and Q3 for the machine control circuit power supply enable-circuit. When the EN-B side is low potential, Q2 will be conducted. After Q2 conduction, the machine control circuit can have electricity to carry out normal work. The actual effect is when the four water faucet control line is connected to the control line interface of boiled water machine, the machine control circuit will have electricity to start normal work to avoid a separate boiled water machine to start heating after electrifying hot water overflow caused by burns.

Figure 11:
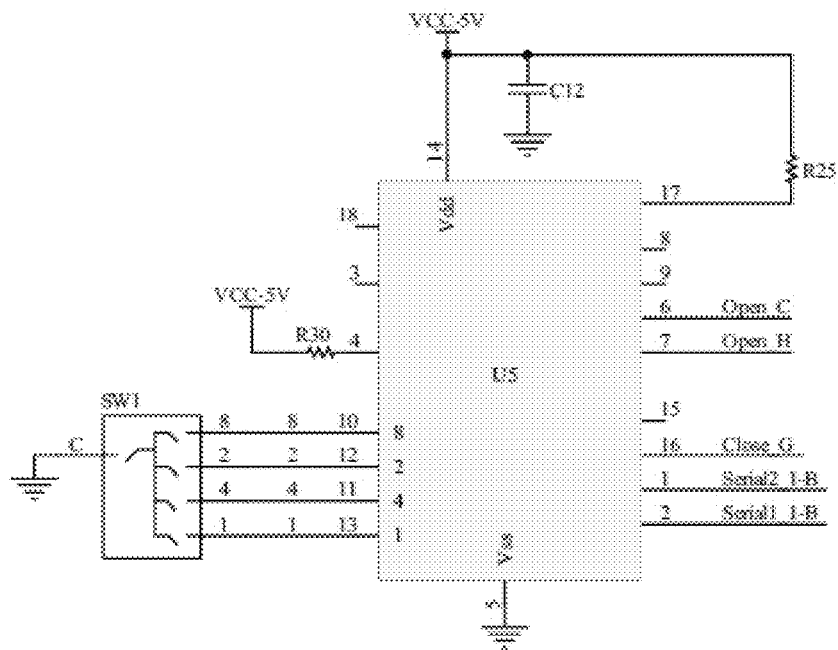
FIG. 11 is a part circuit view of the second control unit of the control device for faucet assemblies.

FIG. 11 is a part circuit view of the second control unit the control device of the invention. Wherein U5 is a four water flow second control microcontroller, and is mainly used to send command control solenoid valve. SW1 is a rotary switch for setting delay time of cold water.

Figure 12:
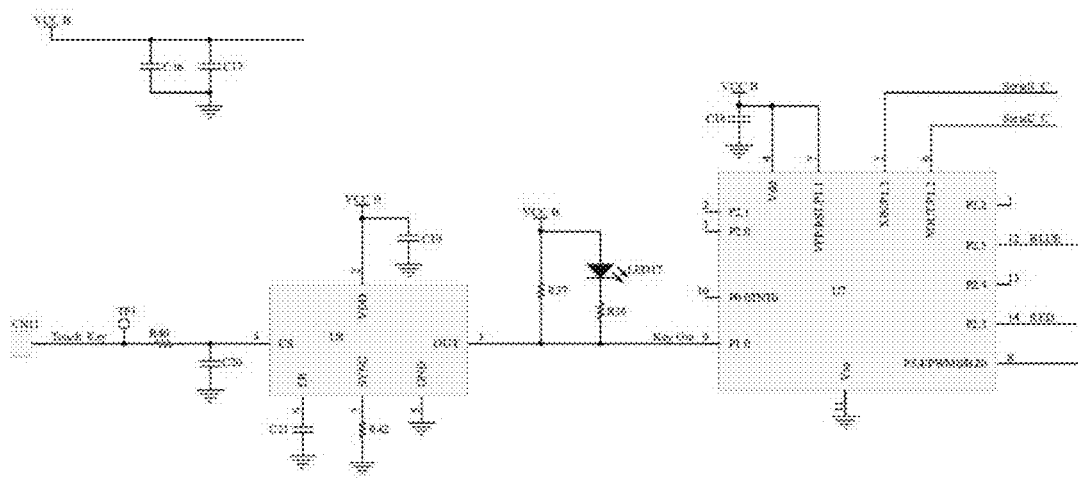
FIG. 12 is a part circuit view of the touch control and the first control unit of the control device for faucet assemblies.
Figure 13:
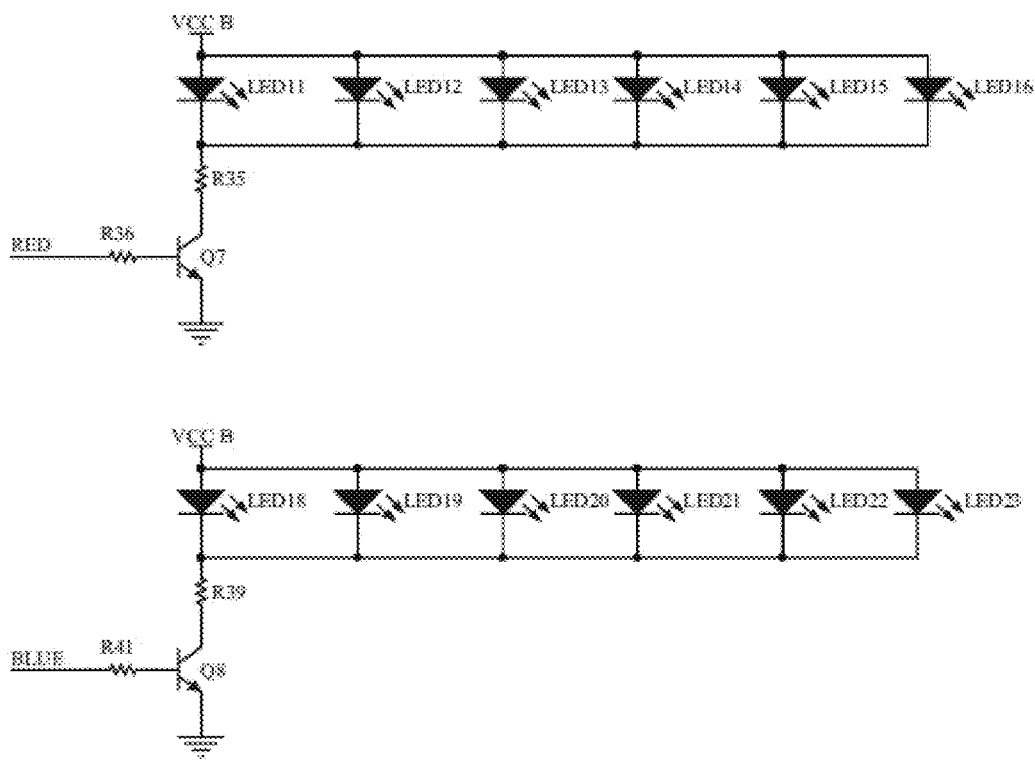
FIG. 13 is a circuit view of touch control light plate of the control device for faucet assemblies.

FIG. 12 is a circuit part view of the touch control and the first control unit of the control device of the invention. Wherein C16, C17 are filter capacitors. U8 are a capacitive touch sensor chip. U7 is a four water flow first control microcontroller, and is mainly used to send commands to control the indicator light above of the four water faucet. U5 in FIG. 9 and U7 in FIG. 10 communicate via interfaces Serial1 and Serial2 for transmitting touch signals above the four water faucets to U5 to generate commands to control the solenoid valve action;

FIG. 13 is a circuit view of touch control light plate of the control device of the invention. Wherein LED11~LED16 are red LED. LED18~LED23 are blue LED. Q7 is a drive transistor of the red LED indicator light. Q8 is a drive transistor of the blue LED indicator light. R35 is a current limiting resistor of the red LED. R39 is a current limiting resistor of the blue LED.

Although the embodiments of the present invention have been disclosed above, they are not limited to the applications previously mentioned in the specification and embodiments, and can be applied in various fields suitable for the present invention, For ordinary skilled person in the field, other various changed. model, formula and parameter may be easily achieved without creative work according to instruction of the present invention, changed, modified and replaced embodiments without departing the general concept defined by the claims and their equivalent are still included in the present invention. The present invention is not limited to particular details and illustrations shown and described herein.

What is claimed is:

1. A control device for faucet assemblies, the faucet assemblies comprising:
a faucet spout with a first water outlet and a second water outlet;
a first water supply pipe communicating with the first water outlet, and
a second water supply pipe communicating with the second water outlet, the second water supply pipe containing a water outlet pipe section connected with the second water outlet and a first water inlet pipe section and a second inlet pipe section communicating with the water outlet pipe section, being characterized in that: the control device comprises a first solenoid valve provided on the first water inlet pipe section to control on-off of the first water inlet pipe section;
a second solenoid valve provided on the second water inlet pipe section to control on-off of the second water inlet pipe section;
a capacitive touching unit disposed on the faucet spout, the capacitive touching unit for sensing touch time of human body and emitting touch signal; and
a second control unit electrically connected to the capacitive touching unit to switch the first solenoid valve and the second solenoid valve in accordance with a touch signal of the capacitive touching unit to control opening and closing of the second water outlet, when touch time is less than a first predetermined time, turning on the second solenoid valve, when touch time is greater than a second predetermined time, turning on the second solenoid valve;
the second water outlet of the faucet assemblies is connected to a manual valve which connects a hot water and a cold water, and water outlet temperature is adjusted by the manual valve; the hot water passes through the first solenoid valve, a house and a throat section on the first inlet pipe section and the heater into the first water outlet, a third solenoid valve for backflow hot water is provided between the heater and the first water outlet; the cold water passes through the second solenoid valve, the house and the throat section disposed on the second inlet pipe section into the first water outlet;
the control device also includes a delay switch for adjusting the second control unit for setting delay turn-off time;
wherein the second control unit does not receive touch signal of the capacitive touch unit again within a continuous delay turn-off time after receiving last touch signal of the capacitive touch unit, a control module controlling the first solenoid valve or the second solenoid valve to be closed.

2. The control device for faucet assemblies according to claim 1, being characterized in that: the capacitive touching unit comprises:
a touch key disposed on the faucet spout;
a capacitive sensing module connected with the touch key to sense action of human body touching the touch key; and
a touch sensing circuit connected to the capacitive sensing module to detect touch time of human body touching the capacitive sensing module and to generate a touch signal according to the touch time.

3. The control device for faucet assemblies according to claim 1, being characterized in that: the first predetermined time is 1 s, and the second predetermined time is 3s.

4. The control device for faucet assemblies according to claim 3, being characterized in that: the control device also comprises a manual valve provided on the faucet spout to control opening and closing of the first water outlet.

5. The control device for faucet assemblies according to claim 4, being characterized in that: the first solenoid valve is disposed on the upstream side of the heater along water outlet direction, and controls water flow entering into the heater;
the second solenoid valve disposed on the upstream side of the housing along water outlet direction for controlling water flow entering into the water outlet pipe section.

6. The control device for faucet assemblies according to claim 5, being characterized in that: the control device also comprises a third solenoid valve disposed on the downstream side of the heater along water outlet direction for controlling backflow water from the water outlet pipe section to enter the heater.

7. The control device for faucet assemblies according to claim 6, being characterized in that: the control device also comprises a display device disposed on a touch switch, the display device comprising:
- a red indicator light and a blue indicator light which are turned on or off in accordance with states of the first solenoid valve and the second solenoid valve; and
- a first control unit that controls turning on or off of the red indicator light and the blue indicator light.

8. The control device for faucet assemblies according to claim 4, being characterized in that: a filter is provided on the second water supply pipe.

* * * * *